United States Patent [19]

Nanao et al.

[11] Patent Number: 5,122,508
[45] Date of Patent: Jun. 16, 1992

[54] COPRECIPITATION PROCESS FOR PREPARING RAW MATERIAL POWDER FOR $Y_1BA_2CU_3O_x$ OXIDE SUPERCONDUCTOR

[75] Inventors: Tsutomu Nanao; Kenji Yamamoto; Masao Yokoyama, all of Kobe, Japan

[73] Assignee: Kanegafuchi Kagaku Kogyo Kabushiki Kaisha, Osaka, Japan

[21] Appl. No.: 281,603

[22] Filed: Dec. 9, 1988

[30] Foreign Application Priority Data

Dec. 11, 1987 [JP] Japan ................ 62-314355
Dec. 12, 1987 [JP] Japan ................ 62-314923

[51] Int. Cl.$^5$ .............. C01B 13/36; C01F 11/02; C01F 17/00; C01G 3/02
[52] U.S. Cl. .................. 505/1; 423/493; 423/604; 423/635; 501/123; 505/737; 505/738
[58] Field of Search ............ 505/1, 737, 738; 502/346; 501/123; 423/604, 635, 593

[56] References Cited

U.S. PATENT DOCUMENTS

| | | | |
|---|---|---|---|
| 4,636,378 | 1/1987 | Pastor et al. | 423/636 |
| 4,643,984 | 2/1987 | Abe et al. | 423/598 |
| 4,661,287 | 4/1987 | Clark | 423/593 |
| 4,696,810 | 9/1987 | Shirasaki et al. | 423/598 |
| 4,764,357 | 8/1988 | Sherif et al. | 505/1 |
| 4,845,056 | 7/1989 | Yamanis | 501/94 |
| 5,019,555 | 5/1991 | Chin et al. | 505/1 |

FOREIGN PATENT DOCUMENTS 0292125 11/1988 European Pat. Off.

OTHER PUBLICATIONS

Wang et al., *Inorg. Chem.*, 26, 1474 (1987).
Inoue et al., *Jpn. J. Applied Physics*, 26, L 1443 (1987).
Fujiki, M. et al, "Preparation of a High-$T_c$ Y—Ba—Cu—O Superconductor Using Colloidal Methods", *Japanese Journal of Applied Physics*, vol. 26, No. 7, Jul. 1987, pp. L1159-L1160.
Kaneko, K., et al, "On the Coprecipitation Method for the Preparation of High $T_c$ M—X—Cu—O (M=Ba, Sr, X=La, Y) System", *Japanese Journal of Applied Physics*, vol. 26, No. 5, May, 1987, pp. L734-L735.
Nakahara "On the defect structure of Grain Boundaries in ..." *Mat. Res. Soc. Symp. Proc.* vol. 99 Dec. 4, 1987, pp. 575-578.
Bordia "Sintering and Microstructure—Property Relations for ..." *Mat. Res. Soc. Symp. Proc.* vol. 99, Dec. 4, 1987 pp. 245-248.
Viegers "Oxygen Content, Microstructure and Superconductivity of ..." *J. Mater. Res.* 2(6) Nov./Dec. 1987 pp. 743-749.
Pfalzgraf "Alkoxides as Molecular Precursors for Oxide-based ..." *New Jnl. of Chem.* vol. 11 No. 10 1987 pp. 663-675.
Tarascon "High-Temp. Supercond. Oxide Symthesis and the ..." *ACS Symp.: Chem. of High-T. Sup.* vol. 351 Sep. 1987 pp. 148-209.
R. S. Lin "Application of Gel Technology in Preparation of High—Tc ..." *Mat. Res. Soc. Symp. Proc.* vol. 99 Dec. 1987 pp. 253-256.
Vilminot "Symthesis and Characterization of $YBa_2Cu_3O_{7-x}$ Supercond ..." *Mat. Res. Bull.* vol. 23 1988 pp. 521-529.
Amarakoon "Synthesis, Characterization and Fabrication of High T ..." *Ad. Cer. Matls.* vol. 2, No. 3B Special Issue Jul. 1987 pp. 539-555.
Kawa "Preparation of High-Tc Y—Ba—Cu—O Superconductor" *Jap. Jnl. Appl. Phys.* vol. 26(5) May 1987 pp. L736-737.
Hirabayashi "Structure and Superconductivity in a New Type of ..." *Jap. Jnl. Appl. Phys.* vol. 26(4) Apr. 1987 pp. L454-455.
Manthiram "Synthesis of the High—Tc Superconductor $YBa_2Cu_3O_x$ ..." *Nature* vol. 329 Oct. 22, 1987 pp. 701-702.
Grant *T Hackh's Chemical Dictionary* 5th Ed. McGraw-Hill Bank Company: 1987 p. 470.

Primary Examiner—Paul Lieberman
Assistant Examiner—John Boya
Attorney, Agent, or Firm—Armstrong & Kubovcik

[57] ABSTRACT

A process for preparing a bulk powder for an oxide superconductor which comprises mixing an alcohol solution (I) of a copper nitrate and a lanthanoid metal nitrate with an alcohol solution (II) comprising at least one compound selected from the group consisting of a barium hydroxide and a barium alkoxide to give a coprecipitate, and thermally decomposing the coprecipitate. According to the present invention, compared to the solid-state reaction, fine particles having the particle size of not more than 1 μm can be easily produced because barium carbonate comparatively stable to heat is not formed on calcination, and the desired bulk powder for oxide superconductor can be produced at even lower temperature. Consequently, the obtained bulk powder for the oxide superconductor has fine particles, e.g. the particle size being not more than 1 μm, therefore, the powder is excellent in stoichinometry, large in surface energy and excellent in sintering property.

8 Claims, No Drawings

COPRECIPITATION PROCESS FOR PREPARING RAW MATERIAL POWDER FOR $Y_1Ba_2Cu_3O_x$ OXIDE SUPERCONDUCTOR

BACKGROUND OF THE INVENTION

The present invention relates to a novel process for preparing a bulk powder useful as a raw material for an oxide superconductor, and more particularly to a process for preparing ultra-fine particles for forming a copper-barium-lanthanoid rare earth metal compound oxide (Cu-Ba-Ln oxide) superconductor, wherein barium carbonate $BaCO_3$ is not formed as an intermediate.

It was found that a 1:2:3 formulation of copper-barium-yttrium (yttrium being one of lanthanoid rare earth metals) metal compound oxide (YBCO) having an oxygen-deficient layered perovskite structure was a superconductor showing a superconducting transition temperature exceeding the liquid-nitrogen temperature. Since then, the YBCO has been expected to be practically used for various uses such as semiconductor devices using a superconductor, superconducting magnet, energy storage system, magnetic shield and sensors, because the liquid-nitrogen which is inexpensive and high in cooling efficiency can be used as a coolant. So, energetic studies of the YBCO superconductor have been made in various fields.

The above-mentioned Cu-Ba-Ln oxides such as YBCO are a type of ceramic. In case of using the polycrystalline sintered product as a superconductor material, the same improvements as required in common ceramics are required. That is, in order to secure the performance as the superconductor, it is required that the secondary phase as impurities is not deposited in the crystal grain boundaries of the superconducting oxide formed by sintering: the density of the sintered product is approached to a true density as much as possible; and the grains are uniform and fine in grain size. Further, the oxide is required for performing the superconducting properties to have a very limited composition and crystal structure. For example, it is necessary that the ratio of yttrium, barium and copper (Y/Ba/Cu atomic ratio) is close to 1/2/3, the number of oxygen atoms to ($Y_1Ba_2Cu_3$) is from about 6.7 to 7.0, in other words, the atomic ratio of oxygen to yttrium is about 6.7 to 7 when the Y/Ba/Cu atomic ratio is approximately 1/2/3, and the crystal structure is an orthorhombic structure. When the above requirement composition and crystal structure of the oxide is not satisfied, some of the superconducting properties such as a superconducting transition temperature, a critical current density and a critical magnetic field is consequently lowered. Accordingly, it has been recognized that the sintering conditions and the conditions for preparing the raw material powder for oxide superconductors are important. In other words, it is desired that the bulk powder used as the raw material for the oxide superconductor has a homogenity in metallic ratio (hereinafter referred to as "are excellent in stoichiometry") and are fine in particle size.

According to solid-state reaction known as a usual way for synthesizing the bulk powder for oxide superconductors, a mixture of copper oxide, barium oxide and a rare earth metal oxide is calcined at a high temperature, e.g. about 950° C., for a long time and pulverized, and the calcining and pulverizing procedure must be repeated several times for giving the bulk powder having uniform phase as measured by X-ray analysis. Accordingly, the grain growth occurs, as the result the obtained powder has a particle size as large as several tens of μm. So, problems that the powder is poor in sintering property are still left.

Therefore, for providing a bulk powder for the metal oxide superconductors which is more excellent in stoichiometry and are more fine and uniform in particle size than the powder prepared by the solid-state reaction and for providing the powder by calcining at a lower temperature for a shorter period of time, many studies have been made. As such processes, there have been proposed some methods such as an oxalic acid coprecipitation method, a carbonate coprecipitation method and a gel decomposition method.

However, these processes have the defects as mentioned below respectively in addition to the common problem that there is a step using water, by which the oxide superconductor is apt to be easily damaged.

The oxalic acid coprecipitation method is a method wherein an aqueous solution of oxalic acid or oxalic acid compound is added dropwise to a solution of copper nitrate, barium nitrate and a rare earth metal nitrate in water or an ethyl alcohol-water mixed solvent to give a coprecipitate. In the case of this method, since the pH of the reaction system must be delicately controlled for maintaining the required stoichiometry, it is very difficult to operate the reaction and other additives are required for adjusting the pH.

The carbonate coprecipitation method wherein an aqueous solution of copper nitrate, barium nitrate and a rare earth metal nitrate is neutralized with an alkali metal carbonate such as potassium carbonate to coprecipitate, requires careful washing of the obtained coprecipitate for removing the alkali metal ion remaining therein. Nevertheless, there is a case that the alkali metal remains in the obtained product.

The gel decomposition method is a method wherein citric acid and ethylene glycol are added to an aqueous solution of copper nitrate, barium nitrate and a rare earth metal nitrate and the mixture is heated to give a gelatinous substrate, then the substrate is thermally decomposed. According to this method, carbon may remain in the obtained powder.

Furthermore, in case of the above three methods, the desired product cannot be directly obtained by calcination but can be obtained through formation of a mixture of barium carbonate, copper oxide and a rare earth metal oxide which is the same one as in the solid-state reaction. Therefore, since barium carbonate comparatively stable to heat is present in the calcining step, the synthesis temperature becomes inevitably high, and a homogeneous phase cannot be easily obtained due to diffusion rate-determing step of carbon dioxide gas generating in case of calcining a large amount of the powder at once or calcining that in a vessel deep in bottom.

An object of the present invention is to solve the above-mentioned defects in conventional techniques and to provide a process for preparing a bulk powder for an oxide superconductor without forming barium carbonate as an intermediate product, whereby the temperature of YBCO formation is lowered, thus a fine and good stoichiometric powder is obtained.

This and other objects of the present invention will become apparent from the description hereinafter.

SUMMARY OF THE INVENTION

It has now been found that when an alcohol solution of a barium hydroxide and/or barium alkoxide, which are soluble in alcohols, is mixed with an alcohol solution of a copper nitrate and a rare earth metal nitrate to react them, a barium nitrate insoluble in alcoholic solvents is formed and coprecipitation is caused. Also, the suitable coprecipitation conditions have now been identified.

According to the present invention, there is provided a process for preparing a bulk powder for an oxide superconductor which comprises mixing an alcohol solution (I) of a copper nitrate and a lanthanoid metal nitrate with an alcohol solution (II) comprising at least one compound selected from the group consisting of a barium hydroxide and a barium alkoxide to give a coprecipitate, and thermally decomposing the coprecipitate.

DETAILED DESCRIPTION

In the present invention, a solution (I) wherein the copper nitrate and the lanthanoid metal nitrate are dissolved in the alcohol is used.

There can be used in the invention as the copper nitrate, cuprous nitrate, cupric nitrate, salts of copper (II) soluble in alcohols wherein one anion in two anions forming the salt is nitric acid ion and the other is a halogen such as bromine or chlorine, hydroxyl group, or the like, and the like. Among them, cupric nitrate is generally preferable from the viewpoints of operability, stability and cost. The copper nitrate may be used alone or as an admixture thereof.

It is preferable that the copper nitrate has high purity such as at least 98%, and particularly it is preferable to prevent the contamination with metals other than copper to the utmost. Generally, there can be sufficiently used the copper nitrate having a level of a grade of commercial reagents, i.e. a purity of about not less than 95%. In case that the alcohol solution of the copper nitrate has insoluble impurities, it is preferable that the alcohol solution is filtered off and then it is utilized.

Examples of the lanthanoid metal of the lanthanoid metal nitrate are, for instance, yttrium, lanthanum, neodymium, promethium, samarium, europium, gadolinium, dysprosium, holmium, erbium, thulium, ytterbium, lutetium, and the like. The lanthanoid metal nitrate used in the invention includes lanthanoid metal salts wherein three anions forming the salt with the lanthanoid metal are all nitric acid ions, and lanthanoid metal salts dissoluble in alcohols wherein one or two anions from among the three anions forming the salt are nitric acid ions and the other one or two anions are a halogen such as bromine or chlorine or hydroxyl group. The lanthanoid metal nitrate may be used alone or as an admixtures thereof. Among them, the lanthanoid metal nitrate wherein all of three anions are nitric acid ions is generally preferable from the viewpoints of operability, stability and cost.

The copper nitrate and the lanthanoid metal nitrate may be used as an anhydrous nitrate containing no water of hydration. Hydrates of copper nitrate and lanthanoid metal nitrate containing water of hydration, from the trihydrate to hexahydrate, are preferabley used because the solubility of the nitrate hydrate in the alcohol is good, thus resulting in the easily handling.

As the solvent of the solution (I), that is, the alcohol dissolving the copper nitrate and lanthanoid metal nitrate, any alcohol can be used so long as the alcohol can dissolve the nitrates. Among them, there are preferable monovalent alcohols having 1 to 5 carbon atoms such as methyl alcohol, ethyl alcohol, iso-propyl alcohol and n-propyl alcohol and polyvalent alcohols having 2 to 8 carbon atoms such as ethylene glycol, diethyl glycol, propylene glycol and glycerol. Particularly, methyl alcohol and ethyl alcohol are most preferable because the alcohols can dissolve the metal nitrates in a large amount and the productivity is high on coprecipitation. Also, as the solvent of the solution (I), organic solvents in addition to the alcohol may be added to the alcohol, so long as the solvent can dissolve the copper nitrate and the lanthanoid metal nitrate. Examples of the organic solvents are, for instance, an aromatic solvent such as benzene or toluene, acetic esters, ethers, ketones, and the like. The organic solvent can be used in an amount of at most 50% by weight of the solvent.

The concentration of the alcohol solution (I) is not particularly limited so long as the alcohol solution (I) has concentrations such that the obtained bulk powder for the superconductor have the desired Ln/Cu ratio. From the viewpoints of cost, productivity and filtering efficiency of the coprecipitate, the concentration is usually from about 5 to about 100 g, preferably from about 20 to about 50 g, per 100 g of the solvent.

In the present invention, in addition to the alcohol solution (I), the alcohol solution (II) of the barium hydroxide and/or barium alkoxide is used.

Although the solution (II) of barium hydroxide may be prepared by dissolving a commercial barium hydroxide as it is in the alcohol, it is preferable that, since the commercial one often contains barium carbonate as an impurity, previously, the barium oxide is treated with heat or barium carbonate is thermally decomposed to prepare barium oxide having high purity, the obtained barium oxide is added to the alcohol and then water is added thereto in the same amount as the added alcohol to give the alcohol solution of barium hydroxide. More preferably, the alcohol solution (II) is filtered off to make the solution the clear. It is preferable that the alcohol solution (II) of the barium hydroxide is taken care not to absorb carbonic acid gas in the air.

As the barium alkoxide, there are exemplified compounds having the formula:

$$Ba(OR)_2$$

wherein R is an alcohol residue, i.e. a residue after the removal of OH group of an alcohol. Examples of the alcohols are, for instance, alkyl alcohols having 1 to 20 carbon atoms, preferably from 1 to 4 carbon atoms, such as methyl alcohol, ethyl alcohol, propyl alcohol and butyl alcohol, polyhydric alcohols having 2 to 20 carbon atoms, preferably from 2 to 8 carbon atoms, such as ethylene glycol, ethylene glycol monoalkyl ethers, e.g. ethylene glycol monoethyl ether, and the like. Concrete examples of the barium alkoxides are, for instance, barium dimethoxide, barium diethoxide, barium diisopropoxide, barium di-n-propoxide, barium di-n-butoxide, barium di-t-butoxide, and the like.

Preparation procedures of the alcohol solution (II) of the barium alkoxide are not particularly limited and the alcohol solution (II) can be easily obtained by reacting a commercial barium metal with the predetermined alcohol. When the purity of the barium metal is low or the alcohol solution of the barium alkoxide has insoluble components, the solution is filtered off to make the alcohol solution clear.

The concentration of the alcohol solution (II) of the barium hydroxide and/or barium alkoxide is not particularly limited so long as the barium hydroxide and/or barium alkoxide are/is dissolved in the alcohol to give the alcohol solution. From the viewpoints of cost, productivity and filtering efficiency of the coprecipitate, the concentration is usually from about 1 to about 50 g, preferably from about 1 to about 25 g, per 100 g of the solvent.

Also, in order to prevent the deposition of barium carbonate, it is preferable that the alcohol solution (II) is not exposed to carbonic acid gas in the air.

It is preferable that in the solution (II) are further dissolved ammonia and/or the organic amine, since, in such a case, all of the metal components can be efficiently coprecipitated. Although the reason why all metal components can be coprecipitated by using the ammonia and/or amine has not been made clear, it can be considered as follows:

The coprecipitation is conducted by mixing the alcohol solution (I) with the alcohol solution (II). That is, the copper nitrate and the lanthanoid metal nitrate in the solution (I) are reacted with the barium compound in the solution (II) to form insoluble compounds in the alcohol from the all metal components as shown in the following reaction formula.

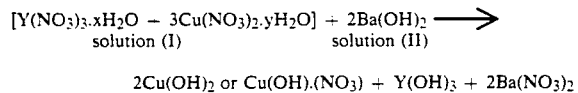

wherein each x and y is an integer of 3 to 6, the reaction formula showing one example of the coprecipitation reactions in the invention wherein the lanthanoid metal is yttrium and the barium compound is barium hydroxide.

However, when the amount of the nitric acid radical is more than that of the barium ion, all of the metal components in the solution (I) cannot be completely formed into the coprecipitate, and a part of the metal nitrates remains in the organic solvents. In such a case, when the ammonia and/or organic amine are/is added to the solution (II), the following reaction is conducted, therefore all of the metal components can be efficiently coprecipitated as the insoluble compounds.

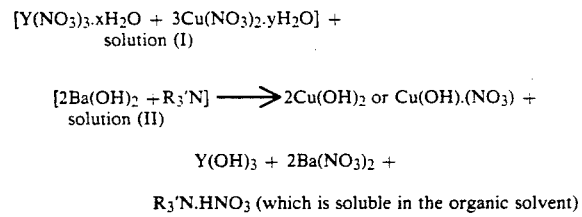

wherein each x and y is as defined above and R' is a hydrogen atom or an alkyl group.

It is preferable that ammonia gas is injected into the alcohol solution (II) or is previously injected into the organic solvent to dissolve. In addition, aqueous ammonia having high concentrations of 25 to 30% by weight can be used. The ammonia is not limited thereto.

Examples of the organic amines are, for instance, primary alkyl amines having 3 to 8 carbon atoms such as isopropyl amine and butyl amine; secondary alkyl amines having 4 to 16 carbon atoms such as diethyl amine, diisobutyl amine and diisopropyl amine; tertiary alkyl amines having 3 to 24 carbon atoms such as trimethyl amine, triethyl amine, tripropyl amine and tributyl amine; primary alkanol amines having 1 to 8 carbon atoms such as monomethanol amine, monoethanol amine, monobutanol amine and monobuthanol amine; secondary alkanol amines having 2 to 16 carbon atoms such as dimethanol amine, diethanol amine, dipropanol amine and dibutanol amine; a tertiary alkanol amine having 3 to 24 carbon atoms such as trimethanol amine, triethanol amine and tripropanol amine; and the like. The organic amines are not limited thereto, and any basic organic amine compound can be used in the present invention so long as the amine is soluble in the organic solvent and does not contain metals such as alkali metals forming impurities in the coprecipitate. Among the above-mentioned ammonia and organic amines, ammonia, butyl amine, diisobutyl amine, diisopropyl amine, triethyl amine, tripropyl amine and tributyl amine are preferably used, since these compounds rapidly reacted with nitric acid radical and comparatively hardly formed into a complex with copper ions. Also, these ammonia and amines may be used alone or as an admixture thereof.

An amount of the ammonia and/or organic amine is suitably determined according to kinds of to metals and the solvents and the combinations thereof. The amount of the ammonia and/or organic amine is generally from 0.05 to 10 moles, preferably from 0.2 to 4 moles, per mole of barium atom, since, within the above-mentioned range, coprecipitates capable of forming the bulk powder having the desired metal ratio can be easily obtained.

When adding the ammonia and/or organic amine to the alcohol solution (II), it is possible that the ammonia and/or organic amine are firstly dissolved in the solvent, then the barium hydroxide and/or barium alkoxide or the solution thereof are dissolved therein, or the alcohol solution of the barium hydroxide and/or barium alkoxide is firstly prepared, then the ammonia and/or organic amine are/is dissolved therein.

As the solvent of the solution (II), the same solvents as the solution (I) can be used. It is preferable that solvents easily dissolve the produced ammonium nitrate or amine nitrate are suitably selected so that the coprecipitate is not contaminated with the above-mentioned produced nitrates. When using the barium hydroxide, methanol is preferable because of a large solubility of barium hydroxide in methanol.

In the present invention, when the solution (I) is mixed with the solution (II) wherein the ammonia and/or organic amine are/is dissolved to react, almost all of the metal components in the solutions (I) and (II) are formed into the coprecipitate without substantially remaining the metals in the solvent.

The amounts of the solutions (I) and (II) are suitably determined according to the components of the desired products, the concentrations of the solutions (I) and (II), and the like. Also, the mixing procedure of the solutions (I) and (II) does not have particular limitations, and any mixing procedure and mixing condition can be applied to the invention so long as the solutions (I) and (II) are rapidly homogenized.

When, for instance, the solution (II) is added gradually dropwise to the solution (I) with mixing, the copper nitrate and the lanthanoid nitrate in the solution (I) are reacted with the barium hydroxide and/or barium alkoxide and the ammonia and/or organic amine to produce a bluish white precipitate wherein the copper hydroxide, complex salt of copper nitrate and copper hydroxide, lanthanoid hydroxide, barium nitrate and complex metal salt of copper, barium and lanthanoid metal are mixed together in molecular size. The coprecipitate is filtered off, and is dried in vacuo, preferably at 50° to 100° C., to give fine coprecipitate powder having an average particle size of 0.05 to 0.5 μm.

The obtained coprecipitate is thermally decomposed by calcining under oxidizing atmosphere at a temperature of not less than 700° C. for 2 to 120 hours preferably at 750° to 900° C. for 2 to 60 hours, more preferably at 800° to 850° C for 4 to 12 hours to give the desired the bulk powder for the oxide superconductor. When the coprecipitate does not come into contact with carbon dioxide in the air upon coprecipitation, heat-treatment or calcination, since barium carbonate is not produced, the effect of the invention that, for instance, the coprecipitate can be calcined at a low temperature, can be more efficiently exhibited.

When the coprecipitate is calcined under nitrogen or an inert gas such as argon atmosphere under the same temperature conditions as mentioned above, the bulk powder with no carbon can be obtained.

The obtained powder by calcining under inert atmosphere are compounds (wherein the crystal structure is tetragonal) with no superconductivity, but from the powder, grains having a shape-anisotropy such as rectangular-shaped with superconductivity can be easily obtained. Therefore, by molding the bulk powder and sintering the mold under oxydizing atmosphere, the anisotropic powder can be obtained and the sintered product is greatly large in critical magnetic field or critical current density to the specific direction compared to usual sintered products.

The thus obtained bulk powder for the oxide superconductor are fine particles, e.g. the particle size being not more than 1 μm, therefore, the powder is large in surface energy and excellent in sintering property compared to those obtained according to the solid-state reaction. The powder is excellent in stoichiometry, therefore, the sintered bodies thereof can be obtained by calcining at a low temperatures such as not more than 950° C. without thermal decmposition of the desired superconducting oxide, and the obtained sintered bodies are small in particle size, high in sintering density and scarcely has impurities such as $BaY_2 \cdot CuO_5$ or $BaCuO_2$ between the grain boundaries. Accordingly, the sintered bodies of the bulk powder according to the present invention is an oxide superconductor having a small change with the passage of time, a narrow width of the superconducting transistion temperature and a large critical current density compared to the oxide superconductor of the raw materials according to the solid-state reaction.

This is, the process for preparing the bulk powder of the oxide superconductor of the invention is more excellent than the solid-state reaction or the conventional coprecipitation methods as shown below.

(1) The coprecipitation is not conducted in water by which the superconductor is apt to be easily damaged but is conducted in the organic solvent, therefore the cases that moisture remains in the desired bulk powder can be decreased.

(2) The operation is easy and the starting materials of the bulk powder are comparatively inexpensive.

(3) Barium carbonate is not produced upon calcining and the desired bulk powder can be obtained at a low temperature in a short period of time.

(4) The obtained powder is small and uniform in particle size.

(5) The coprecipitate is completely composed of inorganic components and carbon is not produced upon calcining.

(6) It is possible to incorporate another metal in a trace amount into the bulk powder.

The present invention is more specifically described and explained by means of the following Examples in which all percentages and parts are by weight unless otherwise noted. It is to be understood that the present invention is not limited to the Examples, and various changes and modifications may be made in the invention without departing from the spirit and scope thereof.

EXAMPLE 1

To 200 g of methanol was added 15.3 g of barium oxide having a purity of not less than 99.9%, and 3.6 g of deionized water was gradially added thereto with stirring and heating to give a methanol solution (A-1) of barium hydroxide.

To 200 g of ethanol were added with stirring 38.4 g of copper nitrate trihydrate [the amount of the copper nitrate trihydrate was determined so that the number of copper atoms was 1.58 times that of barium atoms in the solution (A-1)], and 32.8 g of yttrium nitrate hexahydrate [the amount of the yttrium nitrate hexahydrate was determined so that the number of yttrium atoms is 0.86 time that of barium atoms in the solution (A-1)] to give a methanol solution (B-1). To the solution (B-1) was gradually added dropwise the solution (A-1) to coprecipitate a blush white slurry. One half of the solvent was effused from the obtained slurry by heating with stirring, the concentrated slurry was filtered under pressure, was dried in vacuo at about 50° C., and was roughly pulverized to give a coprecipitate.

The coprecipitate was soluble in an acidic aqueous solution. Also, it was found that the coprecipitate has a Y/Ba/Cu ratio of 1.00/2.07/3.01, according to Inductively Coupled Plasma emission analysis (ICP) as to the aqueous solution thereof. That is, it was confirmed that the obtained coprecipitate had the desired Y/Ba/Cu ratio.

On the other hand, coprecipitate was prepared according to oxalic acid coprecipitation method. That is, to 350 g of an about 20% ethanol solution of oxalic acid was added dropwise 150 g of an about 30% aqueous solution of yttrium nitrate trihydrate, barium nitrate and copper nitrate trihydrate wherein the amount of each nitrate was determined so that the desired product had a Y/Ba/Cu ratio of 1/2/3 to coprecipitate. The obtained coprecipitate was filtered off and dried.

As to the coprecipitates obtained according to the invention and the oxalic acid coprecipitation method, theremogravimetric analysis was conducted. The coprecipitate according to the invention was completely decomposed at such a low temperature as about 700° C. On the other hand, the coprecipitate according to oxalic acid coprecipitation method was completely decomposed at about 830° C.

Further, the coprecipitate obtained according to the present invention was calcined at 750° C. for 3 hours in an atmosphere containing about 50% by volume of oxygen and gradually cooled to give a black powder. With respect to the obtained black powder, crystal structure analysis was conducted according to x-ray diffraction method. As a result of the analysis, it was found that the powder had a crystal structure corresponding to orthorhombic structure and a (Y/Ba/-

Cu)/O ratio of (1.0/2.0/3.0)/6.7 to 6.9, which was the desired product.

Also, the powder prepared to the present invention were observed by using a scanning electron microscope. As a result, it was observed that the powder having a particle size of about 0.4 μm were produced.

EXAMPLE 2

The 250 g of ethanol was added little by little with stirring 16.6 g of metal barium having a purity of not less than 99.9% to give an ethanol solution of barium diethoxide, to which triethyl amine was added in an amount equimolar with the metal barium, 12.25 g and the mixture was stirred to give a uniform ethanol solution (A-2).

To 100 g of ethanol were added with stirring 43.5 g of copper nitrate trihydrate [the amount of the copper nitrate trihydrate was determined so that the number of copper atoms was 1.5 times that of barium atoms in the solution (A-2)], and 23.1 g of yttrium nitrate hexahydrate [the amount of the yttrium nitrate hexahydrate was determined so that the number of yttrium atoms was 0.5 times that of barium atoms in the solution (A-2)] to give an ethanol solution (B-2). To the solution (B-2) was gradually added dropwise the solution (A-2) with violently stirring to coprecipitate a bluish while slurry. The obtained slurry was filtered under pressure with nitrogen gas, it was dried in vacuo at about 60° C., and was roughly pulverized. The filtrate was transparent and precipitation was not caused by adding oxalic acid, i.e. it was confirmed that all of the metal components were coprecipitated.

The coprecipitate was soluble in an acidic aqueous solution. Also, it was found that the coprecipitate had a Y/Ba/Cu ratio of 1.00/1.99/3.01, according to ICP as to the aqueous solution thereof. That is, it was confirmed that the obtained coprecipitate has a very approximate ratio to the desired Y/Ba/Cu ratio.

Further, the coprecipitate was calcined at 750° C. for 6 hours in the atmosphere and gradually cooled down to give a black powder. With respect to the obtained black powder, crystal structure analysis was conducted according to X-ray diffraction method. As the result of the analysis, it was found that the powder had a crystal structure corresponding to orthorhombic structure and a (Y/Ba/Cu)/O ration of 1.0/2.0/3.0)/6.7 to 6.9, which was the desired product.

Also, the powder was observed by using a scanning electron microscope. As a result, it was confirmed that the uniform powder having a particle size of about 0.4 μm were produced.

Furthermore, a polyethylene wax was added to the powder in an amount of 3% of the powder, and was uniformly mixed to coat the powder with the with the wax. The coated powder was subjected to press forming under a pressure of about 1 ton/cm$^2$. The pressed bodies were dried, sintered at 900° C. for 8 hours and gradually cooled down to give a sintered product. As a result of measuring the density of the product, it was found that the product had a density of about 5.83 g/cm$^3$. The value, about 5.83 g/cm$^3$ corresponded to about 91% of the theoretical density. On the other hand, the powder obtained according to the usual solid-state reaction were sintered under the same sintering conditions as above. The sintered product had a density of 4.00 g/cm$^3$, which corresponded to 62% of the theoretical density. Therefore, it wad confirmed that the powder according to the present invention was excellent in sintering property.

Also, on the surface of each of the above-mentioned sintered products, electrodes were formed with silver paste. Then, the property of temperature vs resistivity was measured according to the dc four-probe method. The sintered product according to the solid-state reaction had a critical transition temperature of 90K and a transition temperature width of about 4.5K. On the other hand, the sintered product obtained according to the present invention had a critical transition temperature of 91.5K and a transition temperature width of about 1K, which was apparently excellent in superconducting property.

EXAMPLE 3

To 250 g of methanol was added 20.0 g of barium oxide having a purity of not less than 99.9%, and 2.0 g of deionized water was gradually added thereto with stirring and heating to give a methanol solution of barium hydroxide, to which triethylamine was added in an amount of double the molar quantity of the barium oxide, 25.0 g, and the mixture was stirred to give a uniform solution (A-3).

To 100 g of ethanol were added with stirring 43.70 g of copper nitrate trihydrate [the amount of the copper nitrate trihydrate was determined so that the number of copper atoms was 1.5 times that of barium atoms in the solution (A-3)], and 23.09 g of yttrium nitrate hexahydrat [the amount of the yttrium nitrate hexahydrate was determined so that the number of yttrium atoms is 0.5 time that of barium atoms in the solution (A-3)]to give a ethanol solution (B-3). To the solution (B-3) was gradually added dropwise the solution (A-3) with violently stirring to coprecipitate a blush white slurry.

The obtained slurry was filtered under pressure with nitrogen, it was dried in vacuo at about 60° C., and was roughly pulverized. The filtrate was transparent, and precipitation was not caused by adding oxalic acid, i.e. it was confirmed that all of the metal components were coprecipitated.

The coprecipitate was soluble in an acidic aqueous solution. Also, it was found that the coprecipitate had a Y/Ba/Cu ratio of 1.00/2.01/3.02, according to ICP as to the aqueous solution thereof. That is, it was confirmed that the obtained coprecipitate had a very approximate ratio to the desired Y/Ba/Cu ratio.

As to the coprecipitate, thermogravimetric analysis was conducted. The coprecipitate was completely decomposed at such a low heating temperature as about 700° C.

Further, the coprecipitate was calcined at 750° C. for 6 hours in the atmosphere and gradually cooled down to give a black powder. With respect to the obtained black powder, crystal structure analysis was conducted according to X-ray diffraction method. As a result of the analysis, it was found that the powder had a crystal structure corresponding to orthorhombic structure and a (Y/Ba/Cu)/0 ratio of (1.0/2.0/3.0)/6.7 to 6.9, which was the desired product.

Also, the powder was observed by using a scanning electron microscope. As a result, it was confirmed that the uniform powder having a particle size of about 0.4 μm were produced.

Furthermore, a polyethylene wax was added to the powder in an amount of 3% of the powder, and was uniformly mixed to coat the powder with the wax. The coated powder was subjected to press forming under a pressure of about 1 ton/cm². The pressed bodies were dried, calcined at 900° C. for 6 hours and gradually cooled down to give a sintered product. As a result of measuring the density of the product, it was found that the product had a density of about 5.57 g/cm³. The value, 5.57 g/cm³ corresponded to about 87% of the theoretical density. On the other hand, the powder which was obtained according to the usual solid-state reaction was sintered under the same sintering condition as above. The sintered product had a density of 4.07 g/cm³, which corresponded to about 64% of the theoretical density. Therefore, it was confirmed that the powder according to the present invention was excellent in sintering property.

Also, on the surface of each of the above-mentioned sintered products, electrodes were formed with silver paste. Then, the property of temperature vs resistivity was measured according to the dc four-probe method. The sintered product obtained by using the powder according to the solid-state reaction had a critical transition temperature of 90K and a range of transition temperature width of about 4.5K. On the other hand, the sintered product obtained according to the present invention had a critical transition temperature of 92K and a transition temperature width of about 1K, which was apparently excellent in superconducting property.

EXAMPLE 4

A solution of barium hydroxide (A-4) was prepared in the same manner as in Example 3 except that 7.40 g (equimolar with barium oxide) of monoethanolamine was used instead of triethylamine. The procedure of Example 3 was repeated except that the solution (A-3) was used to give a coprecipitate, and the coprecipitate was calcined in the same manner as in Example 3 to give a bulk powder.

As a result of analyzing the obtained powder according to X-ray diffraction method, it was found that the powder had a crystal structure corresponding to orthorhombic structure and a (Y/Ba/Cu)/0 ratio of (1.0/2.0/3.0)/6.7 to 6.9, which was the same results as in Example 3.

Also, the particle size, density and property of temperature vs resistivity were measured as to the sintered body in the same manner as in Example 3. The sintered body had the properties approximate to those of obtained in Example 3.

EXAMPLE 5

A menthol solution of barium hydroxide with no triethylamine was prepared in the same manner as in Example 3. A solution wherein 21 g of diethanolamine and 3.4 g of ammonia were dissolved in 100 g methanol so that a molar ratio of diethanolamine to ammonia is 1/1 was prepared, and 37.7 g of the thus obtained solution was added to 270 g of the methanol solution of barium hydroxide as used in Example 3 (A-5). The procedure of Example 3 was repeated except that the solution (A-5) was used instead of the solution (A-3) to give a coprecipitate. As to the calcined powder of the coprecipitate, X-ray diffraction was conducted. The results were the almost same as in Example 3. Also, the sintered bodies had the almost same results in particle size, density and property of temperature vs resistivity as in Example 3.

In addition to the ingredients used in the Examples, other ingredients can be used in the Examples as set forth in the specification to obtain substantially the same results.

What we claim is:

1. A process for preparing a bulk powder for the preparation of an oxide superconductor, said powder having a lanthanoid metal to barium to copper ratio of approximately 1:2:3, said process consisting essentially of:
   1) preparing a first alcohol solution containing a lanthanoid nitrate and copper nitrate;
   2) preparing a second alcohol solution containing at least one barium compound selected from the group consisting of barium hydroxide and barium $C_1$–$C_{20}$ alkoxide;
   3) adding said first alcohol solution to said second alcohol solution;
   4) removing the coprecipitate formed in said mixed solution from said solution;
   5) pulverizing said coprecipitate; and
   6) calcining said pulverized coprecipitate in an oxygen-containing atmosphere.

2. A process for preparing a bulk powder for the preparation of an oxide superconductor, said powder having a lanthanoid metal to barium to copper ratio of approximately 1:2:3, said process consisting essentially of:
   1) preparing a first alcohol solution containing a lanthanoid nitrate and copper nitrate;
   2) preparing a second alcohol solution containing at least one barium compound selected from the group consisting of barium hydroxide and barium $C_1$–$C_{20}$ alkoxide and an amine selected from the group consisting of ammonia and alkyl amines;
   3) adding said first alcohol solution to said second alcohol solution;
   4) removing the coprecipitate formed in said mixed solution from said solution;
   5) pulverizing said coprecipitate; and
   6) calcining said pulverized coprecipitate in an oxygen-containing atmosphere.

3. The process of claim 1, wherein said copper nitrate is cupric nitrate.

4. The process of claim 1, wherein said lanthanoid metal nitrate is a lanthanoid metal salt in which the three anions forming the salt are all nitric acid ions.

5. The process of claim 1, wherein said alcohol solution (I) has a concentration of about 5 to 100 g per 100 g of the solvent.

6. The process of claim 1, wherein the alcohol of the alcohol solution (I) is at least one member selected from the group consisting of a monohydric alcohol and polyhydric alcohol.

7. The process of claim 1, wherein said alcohol solution (II) has a concentration of about 1 to 50 g per 100 g of the solvent.

8. The process of claim 2, wherein the amount of the at least one compound selected from the group consisting of ammonia and an organic amine is from 0.05 to 10 moles per mole of barium atom.

* * * * *